(12) United States Patent
Kim et al.

(10) Patent No.: US 12,105,309 B2
(45) Date of Patent: Oct. 1, 2024

(54) POLARIZING PLATE FOR ANTIREFLECTION AND DISPLAY DEVICE COMPRISING THE SAME

(71) Applicant: DONGWOO FINE-CHEM CO., LTD., Iksan-si (KR)

(72) Inventors: Ji Hoon Kim, Hwaseong-si (KR); Jeong Eun Lee, Cheonan-si (KR); Soohwan Park, Seoul (KR)

(73) Assignee: DONGWOO FINE-CHEM CO., LTD., Iksan-si (KR)

( * ) Notice: Subject to any disclaimer, the term of this patent is extended or adjusted under 35 U.S.C. 154(b) by 248 days.

(21) Appl. No.: 17/484,407

(22) Filed: Sep. 24, 2021

(65) Prior Publication Data

US 2022/0099875 A1   Mar. 31, 2022

(30) Foreign Application Priority Data

Sep. 25, 2020   (KR) .................. 10-2020-0125103

(51) Int. Cl.
*G02B 5/30* (2006.01)
*H10K 50/80* (2023.01)
*H10K 50/86* (2023.01)

(52) U.S. Cl.
CPC .......... *G02B 5/3025* (2013.01); *G02B 5/3083* (2013.01); *H10K 50/86* (2023.02); *H10K 50/868* (2023.02)

(58) Field of Classification Search
CPC ........... G02F 1/133528; G02F 1/13363; G02F 1/133638; G02B 5/3025; G02B 5/3033; G02B 5/3083; H10K 50/86; H10K 50/868
See application file for complete search history.

(56) References Cited

U.S. PATENT DOCUMENTS

2006/0268200 A1   11/2006   Ohgaru et al.
2007/0146887 A1   6/2007   Ikeda et al.
(Continued)

FOREIGN PATENT DOCUMENTS

JP    2017-140725 A    8/2017
KR    10-2009-0122138 A    11/2009
(Continued)

OTHER PUBLICATIONS

Office Action issued Aug. 31, 2023 in U.S. Appl. No. 17/404,477.
Office Action issued Sep. 6, 2023 in U.S. Appl. No. 17/404,492.
Office Action issued Sep. 6, 2023 in U.S. Appl. No. 17/404,524.

*Primary Examiner* — Jia X Pan
(74) *Attorney, Agent, or Firm* — Sughrue Mion, PLLC

(57) ABSTRACT

Provided are a polarizing plate for antireflection containing a polarizer, and a protective layer formed on at least one surface of the polarizer, wherein the polarizing plate has a single transmittance of 44.6% or more and a degree of polarization of 98% or more, and a shrinkage rate in stretching direction of the polarizing plate is 0.5% or less after standing at 85° C. for 240 hours, and a display device including the polarizing plate. The polarizing plate is resistant to curling, prevents bending of a panel occurring after adherence of the panel, and reduces dispersion of reflection color depending on the position, while exhibiting high transmittance. Further, the polarizing plate can be made thinner, and prevent the polarizer from being cut off during a preparation process.

9 Claims, 1 Drawing Sheet

(56) References Cited

U.S. PATENT DOCUMENTS

| | | | |
|---|---|---|---|
| 2016/0259104 A1* | 9/2016 | Lee | G02B 5/3033 |
| 2018/0134854 A1* | 5/2018 | Kim | D06P 1/673 |
| 2020/0264460 A1 | 8/2020 | Hatanaka | |

FOREIGN PATENT DOCUMENTS

| | | | | |
|---|---|---|---|---|
| KR | 10-2011-0076179 A | | 7/2011 | |
| KR | 20150109852 A | * | 10/2015 | |
| KR | 20190074227 A | * | 6/2019 | |
| KR | 10-2020-0054184 A | | 5/2020 | |
| KR | 10-2020-0054185 A | | 5/2020 | |
| KR | 10-2021-0032911 A | | 3/2021 | |
| WO | 2011/162259 A1 | | 12/2011 | |
| WO | WO-2017204161 A1 | * | 11/2017 | B32B 27/08 |
| WO | 2019/054271 A1 | | 3/2019 | |
| WO | 2020/021847 A1 | | 1/2020 | |

\* cited by examiner

【FIG. 1】
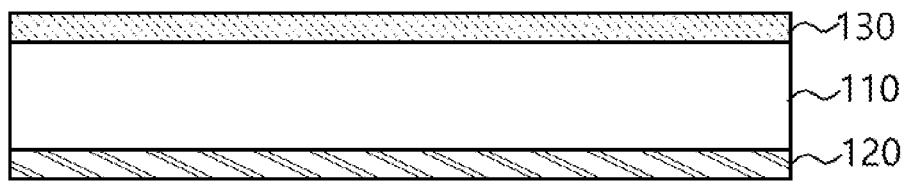
【FIG. 2】
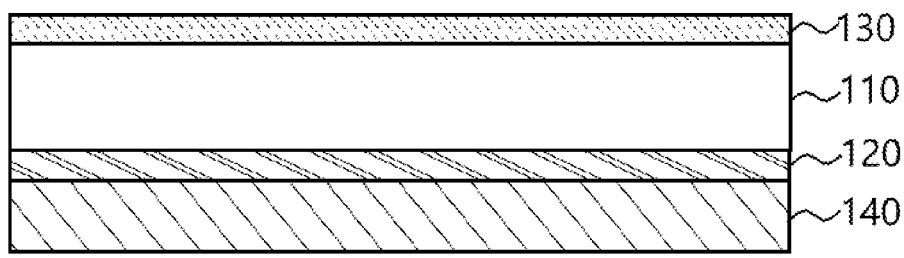
【FIG. 3】
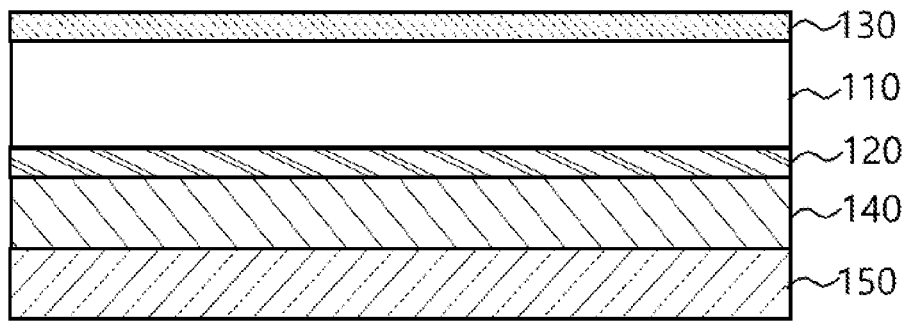
【FIG. 4】
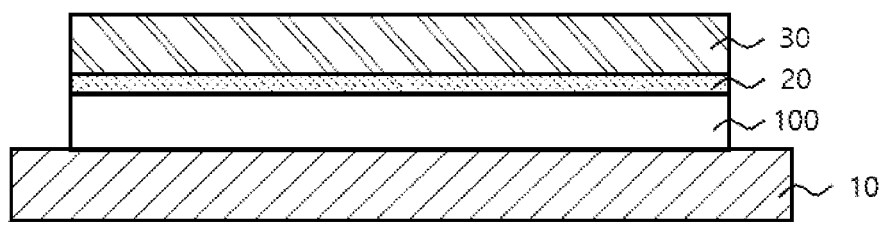

POLARIZING PLATE FOR ANTIREFLECTION AND DISPLAY DEVICE COMPRISING THE SAME

CROSS REFERENCE TO RELATED APPLICATIONS

This application claims priority based on Korean Patent Application No. 10-2020-0125103, filed Sep. 25, 2020, the content of which is incorporated herein by reference in its entirety.

TECHNICAL FIELD

The present invention relates to a polarizing plate for antireflection and a display device comprising the same. More particularly, the present invention relates to a thin type polarizing plate for antireflection and a display device comprising the same, in which curls of the polarizing plate can be suppressed, bending of a panel occurring after adherence of the panel can be prevented, dispersion of reflection color depending on the position is low, and the polarizer can be prevented from being cut off during a preparation process, while exhibiting high transmittance.

BACKGROUND ART

Organic light-emitting diode (OLED) panels may reflect external light such as sunlight and lighting, due to exposure of electrodes. Therefore, in the organic light-emitting diode (OLED) panel, the reflected external light may lower visibility and contrast ratio, which may deteriorate display quality.

Accordingly, in order to block reflection of external light on the surface in a power-off state and have black visibility, Korean Patent Application Publication No. 2009-0122138 has proposed attaching a circular polarizing plate having a linear polarizer combined with a λ/4 retardation layer on the viewing side of the OLED panel.

However, when the polarizing plate for antireflection is applied in this way, there is a problem in that the luminance of the OLED panel is lowered. Accordingly, it is necessary to improve the transmittance of the polarizing plate for antireflection to minimize the decrease in luminance without deterioration of degree of polarization in order to maintain the inherent performances of the polarizing plate for antireflection.

Further, developments for the technologies which can suppress curls of the polarizing plate and prevent bending of a panel caused by shrinkage of the polarizing plate after adherence of the panel, and also, can minimize retardation change at the end of the panel and the resulting difference in reflection color depending on the position have been required.

Moreover, as display devices become thinner recently, there has been a need for thinner polarizing plates, and it is necessary to develop a solution to prevent the polarizer from being cut off during a process for preparing a thin-type polarizer.

DISCLOSURE

Technical Problem

It is an object of the present invention to provide a thin type polarizing plate for antireflection in which curls of the polarizing plate can be suppressed, bending of a panel occurring after adherence of the panel can be prevented, dispersion of reflection color depending on the position is low, and the polarizer can be prevented from being cut off during a preparation process, while exhibiting high transmittance.

It is another object of the present invention to provide a display device comprising the polarizing plate for antireflection.

Technical Solution

In one aspect, the present invention provides a polarizing plate for antireflection comprising a polarizer, and a protective layer formed on at least one surface of the polarizer, wherein the polarizing plate has a single transmittance of 44.6% or more and a degree of polarization of 98% or more, and a shrinkage rate in stretching direction of the polarizing plate is 0.5% or less after standing at 85° C. for 240 hours.

In one embodiment of the present invention, the polarizer may be prepared by controlling underwater stretching rate/air stretching rate to 0.3 or less and controlling a total stretching ratio to more than 3.5 times and less than 5.5 times in a stretching step.

In one embodiment of the present invention, the polarizer may be crosslinked in a crosslinking bath of 50 to 70° C.

In one embodiment of the present invention, the polarizer may have a thickness of 8 μm or less.

In one embodiment of the present invention, the polarizing plate for antireflection may further comprise a retardation layer laminated on the opposite side of the viewing side of the polarizer having the protective layer on at least one surface thereof.

In one embodiment of the present invention, the retardation layer may comprise a λ/4 retardation layer.

In one embodiment of the present invention, the retardation layer may be a λ/4 retardation layer; a retardation layer in which a λ/2 retardation layer and a λ/4 retardation layer are laminated sequentially from the viewing side; or a retardation layer in which a λ/4 retardation layer and a positive C plate layer are laminated sequentially from the viewing side.

In one embodiment of the present invention, the polarizing plate for antireflection may further comprise a pressure-sensitive adhesive layer laminated on the opposite side of the viewing side of the retardation layer.

In one embodiment of the present invention, the polarizing plate for antireflection may further comprise a releasable protective film laminated on the viewing side of the polarizer having the protective layer on at least one surface thereof.

In one embodiment of the present invention, the polarizing plate for antireflection may further comprise a release film laminated on the opposite side of the viewing side of the pressure-sensitive adhesive layer.

In another aspect, the present invention provides a display device, comprising the polarizing plate for antireflection; and an OLED panel laminated on the opposite side of the viewing side of the polarizing plate for antireflection.

In still another aspect, the present invention provides a display device, comprising the polarizing plate for antireflection;

an OLED panel laminated on the opposite side of the viewing side of the polarizing plate for antireflection; and a cover window attached on the viewing side of the polarizing plate for antireflection via a transparent adhesive layer.

Advantageous Effects

The polarizing plate for antireflection according to the present invention can suppress curls of the polarizing plate, prevent bending of a panel occurring after adherence of the panel, and reduce dispersion of reflection color depending on the position, while having high transmittance. Further, the polarizing plate for antireflection according to the present invention can be made thinner, and prevent the polarizer from being cut off during a preparation process.

BRIEF DESCRIPTION OF DRAWINGS

FIGS. 1 to 3 are cross-sectional views schematically illustrating the polarizing plate for antireflection according to one embodiment of the present invention.

FIG. 4 is a cross-sectional view schematically illustrating the display device according to one embodiment of the present invention.

BEST MODE

Hereinafter, the present invention will be described in more detail.

The present invention relates to a polarizing plate for antireflection comprising a polarizer, and a protective layer formed on at least one surface of the polarizer, wherein the polarizing plate has a single transmittance of 44.6% or more and a degree of polarization of 98% or more, and a shrinkage rate in stretching direction of the polarizing plate is 0.5% or less after standing at 85° C. for 240 hours.

The single transmittance and the degree of polarization are measured using an ultraviolet and visible light spectrophotometer (UV-Vis spectrophotometer). In this case, the single transmittance and the degree of polarization are defined by Equations 1 and 2 below.

$$\text{Single Transmittance } (Ty) = (T_1 + T_2)/2 \quad \text{[Equation 1]}$$

wherein, $T_1$ is a parallel transmittance obtained when a pair of polarizing plates are arranged in a state in which absorption axes are parallel, and $T_2$ is an orthogonal transmittance obtained when a pair of polarizing plates are arranged in a state in which absorption axes are orthogonal to each other.

$$\text{Degree of Polarization } (P) = [(T_1 - T_2)/(T_1 + T_2)]^{1/2} \times 100 \quad \text{[Equation 2]}$$

wherein, $T_1$ is a parallel transmittance obtained when a pair of polarizing plates are arranged in a state in which absorption axes are parallel, and $T_2$ is an orthogonal transmittance obtained when a pair of polarizing plates are arranged in a state in which absorption axes are orthogonal to each other.

The single transmittance of the polarizing plate is, as described above, 44.6% or more, preferably 44.6% to 45.4%, more preferably 44.6% to 45.2%. If the single transmittance of the polarizing plate is less than 44.6%, the luminance of display may be lowered, and if the single transmittance of the polarizing plate exceeds 45.4%, the initial degree of polarization may be low, and thus the reflectance in a panel state may be increased or the visibility of stains of the polarizing plate may be increased.

The degree of polarization of the polarizing plate is, as described above, 98% or more, preferably 98.2% or more, more preferably 98.4% or more, for example 98.4% to 99.9%. If the degree of polarization of the polarizing plate is less than 98%, antireflection performance may deteriorate.

The polarizing plate has a shrinkage rate in stretching direction of 0.5% or less, after standing at 85° C. for 240 hours, that is, under heat resistant condition. The shrinkage rate in stretching direction under the heat resistant condition is defined by Equation 3 below. The stretching direction means machine direction (MD).

$$\text{Shrinkage rate in stretching direction } (\%) = [(S_1 - S_2)/S_1] \times 100 \quad \text{[Equation 3]}$$

wherein, $S_1$ is a length of the polarizer in stretching direction before standing under heat resistant condition, and $S_2$ is a length of the polarizer in stretching direction after standing under heat resistant condition.

If the shrinkage rate in stretching direction of the polarizing plate under the heat resistant condition is more than 0.5%, a panel may be bent after adhered due to the shrinkage of the polarizing plate, or the retardation may vary depending on the position of the panel, so that the dispersion of reflection color may increase. Further, it can be difficult to control the curls of the polarizing plate, and the polarizer may be cut off during the preparation process.

The polarizing plate for antireflection according to one embodiment of the present invention can minimize the difference in reflection color depending on the position of the panel and suppress the curls of the polarizing plate, and prevent the bending of the panel, while preventing the polarizer from being cut off during the preparation process, by controlling the shrinkage rate in stretching direction of the polarizing plate to 0.5% or less after standing at 85° C. for 240 hours as described above.

FIG. 1 is a cross-sectional view schematically illustrating the polarizing plate for antireflection according to one embodiment of the present invention.

Referring to FIG. 1, the polarizing plate for antireflection 100 according to one embodiment of the present invention comprises a polarizer 110, a first protective layer 120 formed on one surface of the polarizer, and a second protective layer 130 formed on the other surface of the polarizer. Although FIG. 1 shows a structure in which the protective layers are laminated on both surfaces of the polarizer, the protective layer may be laminated on only one surface of the polarizer.

The polarizer 110 is prepared by dyeing a hydrophilic polymer film with iodine or a dichroic dye followed by aligning. As the hydrophilic polymer film, a polyvinyl alcohol-based film, a partially saponified polyvinyl alcohol-based film and the like may be used.

The degree of polymerization of the polyvinyl alcohol-based film may be typically 500 to 10,000, preferably 1,000 to 6,000, more preferably 1,400 to 4,000. In the case of the saponified polyvinyl alcohol-based film, the degree of saponification may be preferably 95.0 mol % or more, more preferably 99.0 mol % or more, even more preferably 99.9 mol % or more in terms of solubility.

The type of the hydrophilic polymer film is not particularly limited to the polyvinyl alcohol-based film, as long as the film can be dyed with iodine or a dichroic dye. For example, a hydrophilic polymer film such as a polyethylene terephthalate film, an ethylene-vinyl acetate copolymer film, an ethylene-vinyl alcohol copolymer film, a cellulose film and a partially saponified film thereof; and a polyene alignment film such as a dehydration-treated polyvinyl alcohol-based film and a dehydrochlorination-treated polyvinyl chloride may be used.

The thickness of the polarizer 110 may be 8 μm or less, for example, in the range of 3 to 8 μm, preferably in the range of 5 to 8 μm. If the thickness of the polarizer 110 exceeds 8 μm, it is hard to make the polarizing plate thin, and the degree of the polarization may be lowered in a high transmission region. If the thickness of the polarizer 110 is within the above range, the thinning of the polarizing plate is possible, and shrinkage force due to the shrinkage/expansion of the polarizer in a dry/humid environment can be reduced, thereby minimizing the occurrence of curls. In addition, it is possible to secure a polarizing plate having a degree of the polarization of a certain level or more in the high transmission region.

In one embodiment of the present invention, the polarizer is prepared by an air stretching step, a swelling step, a dyeing step and a crosslinking step, followed by washing and drying.

The air stretching step is a process of dry stretching an unstretched polyvinyl alcohol-based film before entering into a wet process.

As a method of performing the air stretching step, there can be a method of applying tension to a film and rolling by a pressure roll, a method of applying tension to a film and contacting with a heating roll, a method of stretching while applying tension between rolls installed inside or outside a heating oven, a method of compression stretching by passing between two heating rolls, etc.

The air stretching temperature may be 120 to 140° C. When the air stretching temperature satisfies the above range, the degree of stretching in width direction of the raw film may be uniform, and stains which may occur on the surface can be minimized. The air stretching temperature can be adjusted by controlling the temperature of the roll or the oven during stretching.

The swelling step is a process of immersing the polyvinyl alcohol-based film in a swelling bath filled with an aqueous solution for swelling before dyeing to remove impurities such as dust or anti-blocking agent deposited on the surface of the polyvinyl alcohol-based film, and swelling the polyvinyl alcohol-based film to improve the stretching efficiency and prevent the non-uniformity of dyeing, thereby improving physical properties of the polarizer.

As the aqueous solution for swelling, water (pure water, deionized water) can be used alone, and when a small amount of glycerin or potassium iodide is added thereto, the processability can be improved along with the swelling of the polyvinyl alcohol-based film. It is preferred that the amount of the glycerin is 5% by weight or less and the amount of potassium iodide is 10% by weight or less, based on 100% by weight of the aqueous solution for swelling.

The temperature of the swelling bath is preferably 0 to 45° C., more preferably 10 to 40° C. The performing time of the swelling step (swelling bath immersion time) is preferably 180 seconds or less, more preferably 90 seconds or less. When the immersion time is within the above range, excessive swelling resulting in saturation state can be suppressed, and thus breakage due to softening of the polyvinyl alcohol-based film can be prevented, and adsorption of iodine in the dyeing step can be uniform, thereby improving the degree of polarization.

A stretching step may be performed together with the swelling step, and at this time, the stretching step corresponds to an underwater stretching step.

The swelling step may be omitted, and the swelling may be performed simultaneously in the dyeing step.

The dyeing step is a step of adsorbing iodine onto the polyvinyl alcohol-based film by immersing the polyvinyl alcohol-based film in a dyeing bath filled with an aqueous solution for dyeing containing a dichroic dye, for example, iodine.

The aqueous solution for dyeing may include water, a water-soluble organic solvent, or a mixed solvent thereof, and iodine. The amount of the iodine is preferably 0.4 to 400 mmol/L, more preferably 0.8 to 275 mmol/L, and still more preferably 1 to 200 mmol/L.

In order to further improve the dyeing efficiency, an iodide may be further included as a solubilizing agent. As the iodide, potassium iodide, lithium iodide, sodium iodide, zinc iodide, aluminum iodide, lead iodide, copper iodide, barium iodide, calcium iodide, tin iodide, titanium iodide and the like can be used alone or in combination of two or more. Among them, potassium iodide is preferred in view of its high solubility in water. The amount of the iodide is preferably 0.01 to 10% by weight, more preferably 0.1 to 5% by weight, based on 100% by weight of the aqueous solution for dyeing.

The temperature of the dyeing bath is preferably 5 to 42° C., more preferably 10 to 38° C. The immersion time of the polyvinyl alcohol-based film in the dyeing bath is not particularly limited, but is preferably 0.5 to 20 minutes, more preferably 2 to 10 minutes.

A stretching step may be performed together with the dyeing step, and at this time, the stretching step corresponds to an underwater stretching step.

The crosslinking step is a step of fixing the adsorbed iodine molecules or dyes by immersing the dyed polyvinyl alcohol-based film in an aqueous solution for crosslinking so that the dyeing property by physically adsorbed iodine molecules or dichroic dyes is not deteriorated by an external environment. Although the dichroic dye is not often eluted under moist-resistant condition, the iodine molecules may be often dissolved or sublimated depending on the environment when the crosslinking reaction is unstable, so that sufficient crosslinking reaction is required. In addition, the crosslinking step is important since the polyvinyl alcohol molecules should be stretched at the largest stretching ratio in order to improve optical properties by aligning all polyvinyl alcohol molecules and iodine molecules located between the molecules.

The aqueous solution for crosslinking includes water as a solvent; a boron compound such as boric acid and sodium borate; and an iodide, and may further include an organic solvent which is mutually soluble with water.

The boron compound serves to suppress the occurrence of wrinkles during the process by imparting short crosslinking and rigidity to improve workability and form iodine aligning.

The amount of the boron compound is preferably 1 to 10% by weight, more preferably 2 to 6% by weight, based on 100% by weight of the aqueous solution for crosslinking. If the amount is less than 1% by weight, the crosslinking effect of the boron compound is reduced, making it difficult to impart rigidity. If the amount exceeds 10% by weight, the crosslinking reaction of the inorganic crosslinking agent is excessively activated, so that it is difficult to effectively proceed with the crosslinking reaction of the organic crosslinking agent.

The iodide is used for the uniformity of the degree of polarization in the plane of the polarizer and the prevention of the desorption of the dyed iodine. The iodide may be the same as that used in the dyeing step, and its amount may be 0.05 to 15% by weight, preferably 0.5 to 11% by weight, based on 100% by weight of the aqueous solution for crosslinking. If the amount is less than 0.05% by weight, the iodide ions in the film get out of the film, thereby increasing the transmittance and changing the color value of the polarizer, so that an additional process is required for its control. If the amount exceeds 15% by weight, there is a problem that the iodide ions in the aqueous solution penetrate into the film, thereby lowering the transmittance.

The temperature of the crosslinking bath may be 20 to 75° C., preferably 50 to 70° C., and the immersion time of the polyvinyl alcohol-based film in the crosslinking bath may be 1 second to 15 minutes, preferably 5 seconds to 10 minutes. If the temperature of the crosslinking bath is less than the temperature range, the degree of polarization of the polarizer may be lowered. If the temperature of the crosslinking bath exceeds the temperature range, the cut-off occurrence rate of the polarizer may increase during the preparation process.

A stretching step may be performed together with the crosslinking step, and at this time, the stretching step corresponds to an underwater stretching step.

As described above, the stretching step may be performed together with the swelling step, the dyeing step and/or the crosslinking step, and may be performed as an independent stretching step using a separate stretching bath filled with an aqueous solution for stretching after the crosslinking step. In this case, the stretching step corresponds to an underwater stretching step.

The polarizer may be prepared by controlling the underwater stretching rate/air stretching rate to 0.3 or less, for example 0.15 to 0.3 in the stretching step. If the underwater stretching rate/air stretching rate is less than 0.15, the degree of polarization may be lowered, and problems in the quality of PVA such as stretching stains may occur. If it exceeds 0.3, optical property dispersion and absorption axis dispersion may increase.

The stretching rate is defined by Equation 4 below.

$$\text{Stretching rate (\%)} = [(A_2 - A_1)/A_1] \times 100 \quad \text{[Equation 4]}$$

wherein, $A_1$ is a length of the polarizer before stretching, $A_2$ is a length of the polarizer after stretching.

The underwater stretching rate means cumulative stretching rate of all underwater stretchings.

In the present disclosure, the optical property dispersion means the dispersion of the single transmittance of the polarizing plate.

In the present disclosure, the absorption axis dispersion means the dispersion in the width direction, that is, the transverse direction (TD) of the absorption axis (the angle between the absorption axis and the MD direction), when the stretching direction, that is, the machine direction (MD), is set to 0°.

Further, the polarizer may be prepared by controlling the total stretching ratio to more than 3.5 times and less than 5.5 times, preferably 4 to 5 times. If the total stretching ratio is 3.5 times or less, the degree of polarization may be lowered, and if it is 5.5 times or more, the polarizer may be cut off during the preparation process.

The washing step is a step of immersing the polyvinyl alcohol-based film after crosslinking and stretching into a washing bath filled with an aqueous solution for washing to remove unnecessary residues such as boric acid attached on the polyvinyl alcohol-based film during the previous steps.

The aqueous solution for washing may be water, and an iodide may be further added thereto.

The temperature of the washing bath may be preferably 5 to 60° C., more preferably 8 to 40° C. The performing time of the washing step is typically 1 to 60 seconds, preferably 3 to 30 seconds, and more preferably 5 to 20 seconds.

The washing step may be carried out each time the previous step such as the dyeing step, crosslinking step or stretching step is completed. Further, the washing step may be repeated one or more times, and the number of repetitions is not particularly limited.

The drying step is a step of drying the washed polyvinyl alcohol-based film and further improving the alignment of iodine molecules dyed by neck-in due to drying to obtain a polarizer having excellent optical properties.

As a drying method, methods such as natural drying, air drying, heat drying, far-infrared drying, microwave drying, and hot air drying can be used. Recently, microwave drying in which only water in the film is activated and dried has been newly used, and the mainly used method is hot air drying. For example, the hot air drying may be carried out at 30 to 90° C. for 1 to 10 minutes. Further, in order to prevent the deterioration of the polarizer, the drying temperature is preferably 60 to 90° C.

The first protective layer 120 and the second protective layer 130 are attached on both surfaces of the polarizer so as to serve to protect the polarizer 110.

As the first protective layer 120 and the second protective layer 130, any film may be used without particular limitation as long as it has excellent transparency, mechanical strength, thermal stability, moisture barrier property, isotropy and the like. Specifically, a film composed of a thermoplastic resin such as polyester-based resins such as polyethylene terephthalate, polyethylene isophthalate and polybutylene terephthalate; cellulose-based resins such as diacetyl cellulose and triacetyl cellulose; polycarbonate-based resins; acrylic resins such as polymethyl (meth)acrylate and polyethyl (meth)acrylate; styrene-based resins such as polystyrene and acrylonitrile-styrene copolymer; polyolefin-based resins such as polyethylene, polypropylene, polyolefin having a cyclo-based or norbornene structure, and an ethylene-propylene copolymer; vinyl chloride-based resins; polyamide-based resins such as nylon and aromatic polyamide; imide-based resins; polyether sulfone-based resins; sulfone-based resins; polyether ketone-based resins; polyphenylene sulfide-based resins; vinyl alcohol-based resins; vinylidene chloride-based resins; vinyl butyral-based resins; allylate-based resins; polyoxymethylene-based resins; and epoxy-based resins may be exemplified, and a film composed of a blend of the thermoplastic resins can also be used. In addition, a film composed of a thermosetting resin such as (meth)acrylic, urethane-based, epoxy-based, or silicone-based resin or an ultraviolet curable resin may be used. Among them, a cellulose-based film having a surface which is saponified by alkali or the like or an acrylic film is preferred considering polarization properties or durability.

Each of the first protective layer 120 and the second protective layer 130 may have a thickness of 10 to 60 μm, preferably 13 to 25 μm. In addition, the thickness of the first protective layer 120 and the second protective layer 130 may be the same or different. If the thicknesses of the first protective layer 120 and the second protective layer 130 are less than 10 μm, the quality of the polarizing plate may be deteriorated by an external impact, and if they exceed 60 μm, it is difficult to implement a thin film, and the curl of the polarizer may deteriorate due to shrinkage/expansion of the protective layer itself.

The surfaces of the first protective layer 120 and the second protective layer 130 to be adhered to the polarizer may be treated for easy adherence. Examples of the treatment for easy adherence may include dry treatment such as primer treatment, plasma treatment and corona treatment, chemical treatment such as alkali treatment (saponification treatment), and coating treatment for easily forming an adhesive layer.

The first protective layer 120 and the second protective layer 130 may be adhered using an adhesive.

As the adhesive, any suitable adhesive may be used, and materials having excellent transparency, thermal stability, low birefringence and the like are preferred. Specific examples may include water-based adhesives, thermoplastic adhesives, hot-melt adhesives, rubber-based adhesives, thermosetting adhesives, monomer reactive adhesives, inorganic adhesives, and natural adhesives. In view of excellent optical transparency, weather resistance and heat resistance, preferred examples may include a monomer reactive adhesive containing an aliphatic isocyanate as a main component "Takenate 631" (trade name, manufactured by Mitsui Takeda Chemicals), and water-based adhesive containing a modified polyvinyl alcohol having an acetoacetyl group as a main component "GOHSEFIMER Z series" (trade name, manufactured by Nippon Synthetic Chemical Industry).

The thickness of the adhesive layer may be appropriately determined according to the type of resin serving as adhesive, adhesive strength, the environment where the adhesive is used, and the like. The adhesive layer preferably has a thickness of 0.01 μm to 50 μm, more preferably 0.05 μm to 20 μm, and still more preferably 0.1 μm to 10 μm.

The adhering method may be a conventional method in the art, and for example, a method of applying an adhesive composition on the adhering surface of the polarizer or the protective layer using a casting method, a meyer bar coating method, a gravure coating method, a die coating method, a dip coating method, a spray coating method, etc., and then adhering them. The casting method is an application method of flowing down the adhesive composition on the adhering surface while moving the polarizer or the protective layer generally in a vertical direction, a horizontal direction, or an oblique direction between the vertical and horizontal directions. After the adhesive composition is applied, the polarizer and protective layer are inserted between nip rolls and the like and adhered.

After the adherence, a drying treatment may be performed. For example, the drying treatment after the adherence may be performed by applying hot air.

After drying, it is preferred to perform curing at room temperature or a temperature slightly higher than that, for example, at a temperature of 20 to 50° C., for 12 to 600 hours.

In the polarizing plate for antireflection according to one embodiment of the present invention, a retardation layer 140 may be further laminated on the opposite side of the viewing side of the polarizer 110 having the first protective layer 120 and second protective layer 130, as shown in FIG. 2.

The retardation layer 140 may be, for example, a stretched or unstretched polymer film, or a liquid crystal layer formed by curing a reactive mesogen.

For example, in the case that the retardation layer 140 is made of a liquid crystal layer, a reactive mesogen (RM) which is a liquid crystal compound having optical anisotropy and crosslinking property by light or heat may be used.

The retardation layer 140 comprises a λ/4 retardation layer.

The λ/4 retardation layer can convert incident linearly polarized light to elliptically polarized light or circularly polarized light, or conversely, can convert incident elliptically polarized light or circularly polarized light to linearly polarized light. Accordingly, the λ/4 retardation layer can be applied to an OLED panel to prevent reflection of external light, and thus it is possible to implement black visibility in a power-off state.

The retardation layer 140 may have a single-layer structure or a multi-layer structure in which 2 or more layers are laminated. When the retardation layer 140 has a single-layer structure, the retardation layer 140 may consist of a λ/4 retardation layer. When the retardation layer 140 has a multi-layer structure, the retardation layer 140 essentially comprises a λ/4 retardation layer, and may further comprise at least one of a λ/2 retardation layer or a positive C plate layer. The λ/2 retardation layer and the positive C plate layer can be used to improve black visibility of the reflection color.

For example, the polarizing plate for antireflection according to one embodiment of the present invention has a structure where a second protective layer, a polarizer, a first protective layer and a λ/4 retardation layer are laminated sequentially from the viewing side; a structure where a second protective layer, a polarizer, a first protective layer, a λ/2 retardation layer and a λ/4 retardation layer are laminated sequentially from the viewing side; or a structure where a second protective layer, a polarizer, a first protective layer, a λ/4 retardation layer and a positive C plate layer are laminated sequentially from the viewing side.

At this time, each layer constituting the retardation layer may be attached to each other via a PSA (pressure-sensitive adhesive)/adhesive or may be laminated on each other by direct coating.

In addition, the polarizer 110 comprising the first protective layer 120 and the second protective layer 130 may be adhered to the retardation layer 130 using a PSA/adhesive.

As the PSA/adhesive, various PSAs or adhesives known in the art may be used without particular limitation.

For example, as the pressure-sensitive adhesive (PSA), a rubber-based PSA, an acrylic-based PSA, a silicone-based PSA, a urethane-based PSA, a polyvinyl alcohol-based PSA, a polyvinylpyrrolidone-based PSA, a polyacrylamide-based PSA, a cellulose-based PSA, a vinyl alkyl ether-based PSA and the like may be used.

Also, as the adhesive, a photocurable adhesive may be exemplified, but the type of the adhesive is not particularly limited.

The photocurable adhesive is crosslinked and cured by active energy rays such as ultraviolet (UV) and electron beam (EB) to exhibit strong adhesion, and may comprise a reactive oligomer, a reactive monomer, a photopolymerization initiator and the like.

The reactive oligomer is an important component which determines the properties of the adhesive, and forms a polymer bond by photopolymerization to form a cured film. As the reactive oligomer, a polyester-based resin, a polyether-based resin, a polyurethane-based resin, an epoxy-based resin, a polyacrylic-based resin, a silicone-based resin and the like can be used.

The reactive monomer serves as a crosslinking agent and a diluent for the reactive oligomer described above and affects adhesion properties. As the reactive monomer, a monofunctional monomer, a polyfunctional monomer, an epoxy-based monomer, vinyl ethers, cyclic ethers and the like can be used.

The photopolymerization initiator initiates photopolymerization by absorbing light energy to generate radicals or cations, and a suitable one may be selected and used depending on the photopolymerization resin.

In addition, as shown in FIG. 3, the pressure-sensitive adhesive (PSA) layer 150 may be further laminated on the opposite side of the viewing side of the retardation layer 140. The PSA layer 150 serves to attach the polarizing plate for antireflection 100 to the OLED panel 10, or the PSA layer 150 may be attached to a touch panel (not shown).

The PSA layer 150 may be formed using various PSAs known in the art without particular limitation.

For example, as the PSA, a rubber-based PSA, an acrylic-based PSA, a silicone-based PSA, a urethane-based PSA, a polyvinyl alcohol-based PSA, a polyvinylpyrrolidone-based PSA, a polyacrylamide-based PSA, a cellulose-based PSA, a vinyl alkyl ether-based PSA and the like may be used.

The thickness of the PSA layer 150 is preferably 5 to 30 μm, while it is preferred to apply as thin as possible within the range which does not impair workability and durability. More preferably, the thickness is 10 to 25 μm. If the thickness of the PSA layer 150 is less than 5 μm, defects may be recognized as dents and damages in the panel cannot be filled. If the thickness exceeds 30 μm, it may be difficult to attain the thinning of the polarizing plate.

The polarizing plate for antireflection according to one embodiment of the present invention may have a releasable protective film (not shown) laminated on the viewing side of the polarizer 110 having the first protective layer 120 and second protective layer 130.

The releasable protective film comprises a substrate, and a pressure-sensitive adhesive layer formed on one side of the substrate. The pressure-sensitive adhesive layer is attached to the polarizer having protective layers, and when the polarizing plate is attached to a cover window, the pressure-sensitive adhesive layer is released from the polarizer having protective layers, thereby easily removing the protective film. The material of the pressure-sensitive adhesive layer may be the same as the above-exemplified pressure-sensitive adhesive.

The substrate of the protective film may be a polyester film such as polyethylene terephthalate, polybutylene terephthalate and polyethylene naphthalate; or a polyolefin film such as polypropylene and polyethylene.

The thickness of the protective film may be 10 to 150 μm, preferably 25 to 130 μm. If the thickness of the protective film is less than 10 μm, it may be difficult to release the protective film, and if the thickness exceeds 150 μm, the adhesion with the polarizer having protective layers may be lowered.

Further, the polarizing plate for antireflection according to one embodiment of the present invention may have a release film (not shown) laminated on the opposite side of the viewing side of the pressure-sensitive adhesive layer 150.

The release film is removed when the polarizing plate for antireflection is attached to the OLED panel.

The substrate of the release film may be a polyester film such as polyethylene terephthalate, polybutylene terephthalate and polyethylene naphthalate; or a polyolefin film such as polypropylene and polyethylene.

In the substrate of the release film, the surface which contacts with the pressure-sensitive adhesive layer 150 may be release-treated. The release-treatment may be performed by a method of surface treatment using a release agent such as a silicone-based release agent, a fluorine-based release agent, and a long-chain alkyl grafted polymer-based release agent, or plasma treatment.

The thickness of the release film may be 10 to 150 μm, preferably 25 to 130 μm. If the thickness of the release film is less than 10 μm, it may be difficult to release the release film, and if the thickness exceeds 150 μm, the adhesion with the pressure-sensitive adhesive layer 150 may be lowered.

The total thickness of the polarizing plate for antireflection according to the present invention may be 100 μm or less, for example 20 to 100 μm, preferably 25 to 80 μm, and more preferably 30 to 60 μm. Herein, the total thickness of the polarizing plate for antireflection is the thickness excluding the thickness of the releasable protective film and the release film.

One embodiment of the present invention relates to a display device comprising the polarizing plate for antireflection 100.

Referring to FIG. 4, the display device according to one embodiment of the present invention comprises the polarizing plate for antireflection 100; and an OLED panel 10 laminated on the opposite side of the viewing side of the polarizing plate for antireflection 100.

In addition, as shown in FIG. 4, the display device according to one embodiment of the present invention may comprise a cover window 30 attached on the viewing side of the polarizing plate for antireflection 100 via a transparent adhesive layer 20.

The transparent adhesive layer 20 may comprise, for example, a pressure-sensitive adhesive (PSA)/adhesive such as an optically clear adhesive (OCA), an optically clear resin (OCR), etc.

The cover window 30 may be made of a material having durability against external impact and transparency for user visibility. For example, the cover window 30 may be a glass or a polymer film having flexibility. The glass may include a glass material in which flexible properties are implemented. Examples of the polymer film having flexibility may include polyimide (PI), polyethersulphone (PES), polyacrylate (PAR), polyetherimide (PEI), polyethylene napthalate (PEN), polyethylene terephthalate (PET), polyphenylene sulfide (PPS), polyarylate, polycarbonate (PC), cellulose triacetate (TAC), cellulose acetate propionate (CAP), and the like. The polymer film having flexibility may have a hard coating layer formed on at least one side thereof. The hard coating layer may be formed using hard coating compositions known in the art.

The display device according to one embodiment of the present invention may be an organic EL display device and may be in the form of a conventional flat panel display, flexible display or foldable display.

Hereinafter, the present invention will be described in more detail by way of Examples and Experimental Examples. However, these Examples and Experimental Examples are given for illustrative purposes only, and it is apparent to those skilled in the art that the scope of the invention is not intended to be limited by these Examples and Experimental Examples.

Preparation Examples 1 to 10 and Comparative Preparation Examples 1 to 18: Preparation of Polarizer A 20 μm-thick polyvinyl alcohol resin film (Kuraray Co., Ltd.) having an average degree of polymerization of about 2,400 and a degree of hydrolysis of 99.9 mol % or more was uniaxially stretched in the air on a hot roll of 130° C. After that, it was immersed in distilled water for swelling, immersed in an aqueous solution of iodine/potassium iodide/water in a weight ratio of 15/5/100 at 30° C. for 30 seconds, and then immersed in an aqueous solution of potassium iodide/boric acid/water in a weight ratio of 10/5/100 for 1 minutes while uniaxially stretching in the water. Then, after washing with pure water of 15° C. for 1.5 seconds, a drying was performed at 60° C. for 5 minutes to obtain an 8 μm-thick polarizer in which the iodine is adsorbed and aligned on the polyvinyl alcohol. At this time, the underwater stretching rate/air stretching rate, the total stretching ratio and the temperature of the crosslinking bath were controlled as shown in Table 1 below.

Examples 1 to 10 and Comparative Examples 1 to 18: Manufacture of Polarizing Plate According to the following method, a polarizing plate with the same structure as in the embodiment of FIG. 1 was manufactured.

A 25 μm-thick TAC film as the first protective layer 120 was adhered onto the opposite side of the viewing side of the polarizer 110 prepared in Preparation Examples and Comparative Preparation Examples using a water-based adhesive. Then, a 32 μm-thick TAC film having a hard coating layer as the second protective layer was adhered onto the viewing side of the polarizer 110 using a water-based adhesive. As the water-based adhesive, a thermosetting water-based PVA adhesive was used.

After that, the polarizer having the protective layers was subjected to a drying at 60° C. for 5 minutes to obtain a polarizing plate.

Experimental Example

The properties of the polarizers prepared in the Preparation Examples and Comparative Preparation Examples and the polarizing plates prepared in the Examples and Comparative Examples were measured by the following methods, and the results are shown in Table 1 below.

(1) Single Transmittance and Degree of Polarization

The polarizing plate of the Examples and Comparative Examples was cut into a size of 4 cm×4 cm, and the transmittance was measured using a UV-Vis spectrophotometer (V-7100, manufactured by JASCO Inc.). Herein, the single transmittance and the degree of polarization are defined as Equations 1 and 2 below.

$$\text{Single Transmittance } (Ty) = (T_1 + T_2)/2 \quad \text{[Equation 1]}$$

wherein, $T_1$ is a parallel transmittance obtained when a pair of polarizing plates are arranged in a state in which absorption axes are parallel, and $T_2$ is an orthogonal transmittance obtained when a pair of polarizing plates are arranged in a state in which absorption axes are orthogonal to each other.

$$\text{Degree of Polarization } (P) = [(T_1 - T_2)/(T_1 + T_2)]^{1/2} \times 100 \quad \text{[Equation 2]}$$

wherein, $T_1$ is a parallel transmittance obtained when a pair of polarizing plates are arranged in a state in which absorption axes are parallel, and $T_2$ is an orthogonal transmittance obtained when a pair of polarizing plates are arranged in a state in which absorption axes are orthogonal to each other.

(2) Shrinkage Rate in Stretching Direction Under Heat Resistant Condition

After the polarizing plate of the Examples and Comparative Examples was cut into a size of 10 cm×10 cm, the length in stretching direction was measured before and after standing at 85° C. for 240 hours, and the shrinkage rate in stretching direction was calculated according to Equation 3 below.

$$\text{Shrinkage rate in stretching direction } (\%) = [(S_1 - S_2)/S_1] \times 100 \quad \text{[Equation 3]}$$

wherein, $S_1$ is a length of the polarizer in stretching direction before standing under heat resistant condition, and $S_2$ is a length of the polarizer in stretching direction after standing under heat resistant condition.

The shrinkage rate in stretching direction was determined as an average value by measuring the lengths in stretching direction at three points including two points which are 2 cm away from each of two end sides in the stretching direction and a center point.

(3) Cut-Off Occurrence Rate

The polarizer was prepared 10 times under the conditions of the Preparation Examples and the Comparative Preparation Examples, and the cut-off occurrence rate (%) was calculated by checking the number of times that the polarizer is cut off out of the total 10 times, and evaluated according to the following evaluation criteria.

<Evaluation Criteria>

∘: Cut-off occurrence rate is less than 5%

Δ: Cut-off occurrence rate is 5% or more and less than 20% x: Cut-off occurrence rate is 20% or more (4) Reflection Color

The 45° direction to the absorption axis direction of the polarizing plate of Examples and Comparative Examples was set to be parallel to a long side, and the polarizing plate was cut into a size of 155 mm on the long side and 75 mm on the short side. After sequentially adhering a liquid crystal coating type retardation layer (λ/4) and a pressure-sensitive adhesive layer (25 nm) on the first protective layer 120 of the polarizing plate, a reflector made of aluminum material having a total reflectance of 96% or more was attached onto the surface of the pressure-sensitive adhesive layer. After storage in a drying oven at 105° C. for 1 hour, the reflection color was measured with a spectrophotometer (Konica Minolta, model name CM-2600D). At this time, the central reflection color (a*, b*) and the end side reflection color (a*', b*') of the sample were measured, and the reflection color difference was calculated according to Equation 5 below.

$$\text{Reflection color difference} = \sqrt{(a^{*\prime} - a^*)^2 + (b^{*\prime} - b^*)^2} \quad \text{[Equation 5]}$$

(5) Curl Characteristics

After the 45° direction to the absorption axis direction of the polarizing plate of Examples and Comparative Examples was set to be parallel to a long side, the polarizing plate was cut into an A4 size (long side: 297 mm, short side: 210 mm), and curls at the four corners were measured using a ruler. At this time, curls occurring in the direction of the second protective layer 130 (HC-TAC) based on the polarizer were denoted by (+), and curls occurring to the direction of the first protective layer 120 (Glare-TAC) were denoted by (−).

(6) Panel Bending Characteristics

The 45° direction to the absorption axis direction of the polarizing plate of Examples and Comparative Examples was set to be parallel to a long side, and the polarizing plate was cut into a size of 155 mm on the long side and 75 mm on the short side and adhered to a 0.5 mm-thick glass having the same size with a laminator. After the sample was treated at 85° C. for 100 hours and then stabilized at room temperature for 1 hour, the degree of bending of the sample was measured with a two-dimensional measuring instrument (Intek IMS Co. Ltd., PREMIUM 600C model).

TABLE 1

| Content | underwater stretching rate/air stretching rate | Total stretching ratio (times) | Crosslinking bath temperature (° C.) | Single transmittance (%) | Degree of polarization (%) | Shrinkage rate in stretching direction under heat resistant condition (%) | Cut-off occurrence rate (%) | Reflection color dispersion (Center-end side) | Curl characteristics (mm) | Panel bending (mm) |
|---|---|---|---|---|---|---|---|---|---|---|
| Example 1 | 0.3 | 4.0 | 55 | 44.9 | 98.7 | 0.31 | ○ | 0.42 | −2 | 1.1 |
| Example 2 | 0.3 | 4.0 | 65 | 44.8 | 98.8 | 0.28 | ○ | 0.43 | −2 | 1.0 |
| Example 3 | 0.3 | 4.0 | 75 | 44.9 | 98.8 | 0.26 | Δ | 0.41 | −2 | 0.9 |
| Example 4 | 0.3 | 4.5 | 45 | 44.9 | 98.1 | 0.37 | ○ | 0.42 | −1 | 1.4 |
| Example 5 | 0.3 | 4.5 | 55 | 45.0 | 98.9 | 0.33 | ○ | 0.41 | 0 | 1.4 |
| Example 6 | 0.3 | 4.5 | 65 | 44.8 | 99.0 | 0.31 | ○ | 0.37 | +1 | 1.3 |
| Example 7 | 0.3 | 4.5 | 75 | 44.9 | 98.9 | 0.34 | Δ | 0.36 | +2 | 1.2 |
| Example 8 | 0.3 | 5.0 | 55 | 44.9 | 99.0 | 0.44 | ○ | 0.75 | +2 | 1.5 |
| Example 9 | 0.3 | 5.0 | 65 | 44.8 | 98.8 | 0.42 | Δ | 0.73 | +1 | 1.5 |
| Example 10 | 0.3 | 5.0 | 75 | 44.9 | 98.8 | 0.41 | Δ | 0.71 | +3 | 1.4 |
| Com. Ex. 1 | 0.3 | 3.0 | 45 | 44.9 | 89.9 | 0.19 | ○ | 1.21 | −3 | 0.6 |
| Com. Ex. 2 | 0.3 | 3.0 | 55 | 44.9 | 90.3 | 0.21 | ○ | 1.08 | −5 | 0.7 |
| Com. Ex. 3 | 0.3 | 3.0 | 65 | 44.8 | 90.2 | 0.18 | ○ | 1.16 | −4 | 0.7 |
| Com. Ex. 4 | 0.3 | 3.0 | 75 | 44.9 | 90.4 | 0.17 | Δ | 1.12 | −5 | 0.6 |
| Com. Ex. 5 | 0.3 | 3.5 | 45 | 44.9 | 94.5 | 0.22 | ○ | 0.88 | −4 | 0.9 |
| Com. Ex. 6 | 0.3 | 3.5 | 55 | 44.8 | 94.6 | 0.23 | ○ | 0.91 | −5 | 0.8 |
| Com. Ex. 7 | 0.3 | 3.5 | 65 | 44.9 | 95.2 | 0.21 | ○ | 0.89 | −3 | 0.8 |
| Com. Ex. 8 | 0.3 | 3.5 | 75 | 44.8 | 95.1 | 0.20 | Δ | 0.84 | −4 | 0.7 |
| Com. Ex. 9 | 0.3 | 4.0 | 45 | 45.0 | 97.1 | 0.30 | ○ | 0.39 | −2 | 1.1 |
| Com. Ex. 10 | 0.3 | 5.0 | 45 | 44.8 | 98.7 | 0.53 | x | 0.81 | +10 | 3.6 |
| Com. Ex. 11 | 0.3 | 5.5 | 45 | 45.0 | 99.1 | 0.71 | x | 1.32 | +24 | 5.3 |
| Com. Ex. 12 | 0.3 | 5.5 | 55 | 44.9 | 98.8 | 0.73 | x | 1.37 | +31 | 4.9 |
| Com. Ex. 13 | 0.3 | 5.5 | 65 | 44.8 | 98.9 | 0.69 | x | 1.18 | +29 | 5.1 |
| Com. Ex. 14 | 0.3 | 5.5 | 75 | 44.9 | 98.8 | 0.66 | x | — | Unmeasurable due to cut-off | — |
| Com. Ex. 15 | 0.3 | 6.0 | 45 | 45.0 | 98.9 | 0.86 | x | — | Unmeasurable due to cut-off | — |
| Com. Ex. 16 | 0.3 | 6.0 | 55 | 44.9 | 99.1 | 0.87 | x | 1.45 | +39 | 6.9 |
| Com. Ex. 17 | 0.3 | 6.0 | 65 | 44.8 | 99.0 | 0.82 | x | 1.35 | +35 | 6.4 |
| Com. Ex. 18 | 0.3 | 6.0 | 75 | 44.9 | 99.0 | 0.79 | x | — | Unmeasurable due to cut-off | — |

As shown in Table 1, in the case of the polarizing plates of Examples 1 to 10 according to the present invention in which the shrinkage rate in stretching direction after standing at 85° C. for 240 hours was 0.5% or less, the difference in the reflection color depending on the position was small, the curl of the polarizing plate was suppressed, and the bending of the panel was prevented. On the other hand, the polarizing plates of Comparative Examples 10 to 18 in which the shrinkage rate in stretching direction after standing at 85° C. for 240 hours was more than 0.5% was difficult to simultaneously secure the reflection color, the curl characteristics, and the bending characteristics of the panel.

In addition, in the cases of the polarizing plates of Comparative Examples 1 to 8 having a total stretching ratio of 3.5 times or less, the degree of polarization was lowered, and in the cases of the polarizing plates of Comparative Examples 11 to 18 having a total stretching ratio of 5.5 times or more, the shrinkage rate in stretching direction under heat resistant condition was more than 0.5%, and the cut-off occurrence rate of the polarizer during the preparation process was high. Further, the degree of polarization of the polarizer was reduced when the temperature of the crosslinking bath was as low as 45° C., while the cut-off occurrence rate of the polarizer during the preparation process was high when the temperature was too high as 75° C.

Although specific parts of the present invention have been described in detail, it will be apparent to those skilled in the art that these specific descriptions are merely a preferred embodiment and that the scope of the present invention is not limited thereto. In addition, those skilled in the art will appreciate that various applications and modifications are possible, without departing from the scope and spirit of the invention based on the descriptions above.

Therefore, the substantial scope of the present invention will be defined by the accompanying claims and their equivalents.

DESCRIPTION OF REFERENCE NUMERALS

10: OLED panel
20: transparent adhesive layer
30: cover window
100: polarizing plate for antireflection
110: polarizer
120: first protective layer
130: second protective layer
140: retardation layer
150: pressure-sensitive adhesive layer

The invention claimed is:

1. A polarizing plate for antireflection comprising a polarizer, and a protective layer formed on at least one surface of the polarizer,
wherein the polarizer is prepared by controlling underwater stretching rate/air stretching rate to 0.3 or less and controlling a total stretching ratio to more than 3.5 times and less than 5.5 times in a stretching step,
wherein the polarizer is crosslinked in a crosslinking bath of 50 to 70° C., wherein the polarizer has a thickness of 8 μm or less,
wherein the polarizing plate has a single transmittance of 44.6% or more and a degree of polarization of 98% or more,
wherein a shrinkage rate in stretching direction of the polarizing plate is 0.5% or less after standing at 85° C. for 240 hours,
wherein a cut-off occurrence rate (%) of the polarizer during its preparation process is less than 20%, and
wherein the polarizing plate has a reflection color difference of 0.75 or less, defined by Equation 5 below:

$$\text{reflection color difference} = \sqrt{(a^{*\prime}-a^*)^2 + (b^{*\prime}-b^*)^2} \quad \text{[Equation 5]}$$

wherein,
$a^*$ and $b^*$ are reflection color measured at center of the polarizing plate, and
$a^{*\prime}$ and $b^{*\prime}$ are reflection color measured at end side of the polarizing plate.

2. The polarizing plate for antireflection of claim 1, further comprising a retardation layer laminated on the opposite side of the viewing side of the polarizer having the protective layer on at least one surface thereof.

3. The polarizing plate for antireflection of claim 2, wherein the retardation layer comprises a λ/4 retardation layer.

4. The polarizing plate for antireflection of claim 2, wherein the retardation layer is a λ/4 retardation layer; the retardation layer comprises a λ/2 retardation layer and a λ/4 retardation layer which are laminated sequentially from the viewing side; or the retardation layer comprises a λ/4 retardation layer and a positive C plate layer which are laminated sequentially from the viewing side.

5. The polarizing plate for antireflection of claim 2, further comprising a pressure-sensitive adhesive layer laminated on the opposite side of the viewing side of the retardation layer.

6. The polarizing plate for antireflection of claim 5, further comprising a release film laminated on the opposite side of the viewing side of the pressure-sensitive adhesive layer.

7. The polarizing plate for antireflection of claim 1, further comprising a releasable protective film laminated on the viewing side of the polarizer having the protective layer on at least one surface thereof.

8. A display device, comprising:
the polarizing plate for antireflection of claim 1; and
an organic light-emitting diode (OLED) panel laminated on the opposite side of the viewing side of the polarizing plate for antireflection.

9. A display device, comprising:
the polarizing plate for antireflection of claim 1;
an organic light-emitting diode (OLED) panel laminated on the opposite side of the viewing side of the polarizing plate for antireflection; and
a cover window attached on the viewing side of the polarizing plate for antireflection via a transparent adhesive layer.

* * * * *